(12) United States Patent
Schellenberg et al.

(10) Patent No.: US 6,778,695 B1
(45) Date of Patent: Aug. 17, 2004

(54) DESIGN-BASED RETICLE DEFECT PRIORITIZATION

(76) Inventors: Franklin M. Schellenberg, 4023 Villa Vista, Palo Alto, CA (US) 94305; Andrew J. Moore, 609 SW. River Dr., Dallas, OR (US) 97338

( * ) Notice: Subject to any disclaimer, the term of this patent is extended or adjusted under 35 U.S.C. 154(b) by 0 days.

(21) Appl. No.: 09/471,529

(22) Filed: Dec. 23, 1999

(51) Int. Cl.[7] ................................................. G06K 9/00

(52) U.S. Cl. ....................................... 382/144; 382/145

(58) Field of Search ................................. 382/141–143, 382/152; 348/86, 87, 125, 126; 356/237.1, 394; 430/296; 250/492.3

(56) References Cited

U.S. PATENT DOCUMENTS

| | | | | |
|---|---|---|---|---|
| 4,717,644 A | * | 1/1988 | Jones et al. ............... | 250/492.3 |
| 4,758,094 A | * | 7/1988 | Wihl et al. ................ | 356/394 |
| 5,598,341 A | | 1/1997 | Ling et al. | |
| 5,686,206 A | | 11/1997 | Baum et al. ............... | 430/5 |
| 5,994,030 A | * | 11/1999 | Sugihara et al. ........... | 430/296 |
| 6,483,937 B1 | * | 11/2002 | Samuels ................... | 382/144 |

FOREIGN PATENT DOCUMENTS

| | | |
|---|---|---|
| JP | 04 340740 | 11/1992 |
| JP | 07 239306 A | 9/1995 |
| WO | WO00/36525 | 6/2000 |

OTHER PUBLICATIONS

International Seach Report, European Patent Office, Date of Mailing: May 7, 2002, International application No.: PCT/US 00/42830, International filing date: Dec. 22, 2000, pp. 1–4.

* cited by examiner

Primary Examiner—Vikkram Bali
(74) Attorney, Agent, or Firm—Christensen O'Connor Johnson Kindness PLLC

(57) ABSTRACT

Design-based reticle inspection allows for a more efficient prioritization than typical human labor intensive reticle inspection techniques. A processed netlist for an integrated circuit (IC) and/or layout of the IC is used to determine the relative priorities of reticle defects identified by a reticle inspection device. In one embodiment, the processed netlist is a netlist that is derived by a verification tool based on a layout of the IC design. The processed netlist can include component coordinates that indicate the position of the components of the IC. In one embodiment, the processed layout includes derived geometry, for example, critical dimensions and/or device identifications that can be used to determine regions of interest. In one embodiment, defects are prioritized based on the location of the defects with respect to functional portions of the integrated circuit. For example, regions of interest can be determined around certain IC structures (e.g., transistor gates, minimum dimension lines, line corners). In one embodiment, defects within the regions of interest can be repaired while defects outside of the care zone can be ignored. More complex defect prioritization can be provided by prioritizing defects, for example, by size within the regions of interest. By prioritizing defects by areas of interest, the number of defects analyzed by a human operator and/or simulator can be decreased thereby decreasing the cost of reticle inspection and repair.

9 Claims, 5 Drawing Sheets

DESIGN-BASED RETICLE DEFECT PRIORITIZATION

FIELD OF THE INVENTION

The invention relates to inspection of reticles for use in manufacturing integrated circuits. More particularly, the invention relates to use of circuit designs (e.g., netlists, layouts) in inspecting reticles for use in manufacturing integrated circuits.

BACKGROUND OF THE INVENTION

FIG. 1 is one embodiment of an integrated circuit processing arrangement. The general uses of the components of FIG. 1 are known in the art. Light source 100 provides light towards wafer 130. Mask/reticle 110 blocks light for certain predetermined portions of wafer 130. Stepper/scanner 120 directs the patterns of mask/reticle 110 to one of multiple integrated circuits being developed on wafer 130.

High-level integrated circuit (IC) description languages such as VHDL and Verilog® are commonly used to design circuits. One embodiment of VHDL is described in greater detail in "IEEE Standard VHDL Language Reference Manual," ANSI Std. 1076–1993, Published Jun. 6, 1994. One embodiment of Verilog® is described in greater detail in IEEE Standard 1364–1995. These high-level IC description languages allow a circuit designer to design and simulate circuits by using high-level code to describe the structure and/or behavior of the circuit being designed.

The integrated circuit design is used to generate an IC layout. Verification and other procedures can also be performed on the IC design or the IC layout. A set of reticles are created based on the IC layout and the reticles are used to manufacture the IC. Prior to mass production of the IC, the reticles are inspected to determine whether the IC manufactured from the reticles will perform the desired function. At least one reticle is generated for each layer of the IC to be manufactured.

FIG. 2 illustrates a prior art approach to reticle inspection. The high-level IC description language code is used to produce netlist 200 that describes an interconnection of circuit components that provide the desired functionality. Netlist 200 can include coordinate information to describe the position of various circuit components within the overall circuit. Netlist 200 can then be used to develop the layout and ultimately fabricate an integrated circuit IC having the functionality of the designed circuit. Netlist 200 can also be used for emulation and/or verification purposes.

Netlist 200 is used to generate layout 210, which describes the physical layout of an IC. Verification tool 220 can compare layout 210 to netlist 200 to verify that layout 210 is an accurate representation of netlist 200. Layout 210 can be modified as necessary based on results generated by verification tool 220.

Layout 210 is used to generate reticle database 230, which is used to generate reticle 240. Reticle production equipment (not shown in FIG. 2) generates reticle 240 from reticle database 230 in any manner known in the art. This can include exposure to electron beams, laser beams, or ion beams using mask writing tools such as, for example, the MEBES 4500 or ALTA 3500 available from ETEC Corporation of Hayward, Calif.

Once fabricated, reticle 240 is then inspected for defects using inspection device 250. Inspection device 250 can be, for example, Model 351 Inspection System, manufactured by KLA-Tencor of San Jose, Calif. Several techniques for identifying defects are known in the art that typically compare the image of a reticle under inspection with a reference image. The reference image can be, for example, an adjacent identical layout (die:die, or die-to-die inspection), or a reference image derived from the layout (die:database, or die-to-database inspection). In either case, mismatched geometries are flagged as a defect. In either case, defects identified by inspection device 250 are output as defect list 260. Defect list 260 can also be referred to as an inspection report.

In a typical prior art reticle inspection system, inspection device 250 flags defects based solely on a mismatch of feature geometries between the image and the database pattern. Defect list 260 is then reviewed by a human operator, who examines the image of each defective location on the reticle and classifies the defect. From the classification, the operator determines which defects are insignificant and which require repair. Defect list 260 may be prioritized by the human operator, for example, by size of defect. Defects are repaired at 280 in any manner known in the art.

The reticle inspection and repair technique of FIG. 2 is also generally human labor intensive and therefore expensive. As integrated circuits become smaller and smaller, the potential for defects increases and the percentage of defects that must be repaired increases, which results in more work for the human operator and a greater expense to manufacture an operable integrated circuit. In other words as the size of an IC decreases and/or the number of layers of the IC increases, the cost of reticle inspection increases.

A prior art solution to this is to prioritize the defects and eliminate the insignificant defects from the defect list using simulation. In this case, the effect the defect will have on the IC is simulated using conventional simulation techniques, and the defects are prioritized by the effective size on the wafer. However, this solution is not ideal. The amount of time for an accurate simulation can be larger than for human review, and all defects must be simulated to allow the prioritization to occur. As the number of defects increases with smaller feature size, this can potentially increase the total time required for defect evaluation.

What is needed is an improved reticle inspection and repair technique that results in decreased simulation requirements and/or faster defect evaluations, while still accurately identifying all defects that will impact the device being fabricated.

SUMMARY OF THE INVENTION

Methods and apparatuses for netlist based reticle defect prioritization are described. A defect list is generated in response to an inspection of a reticle for use to manufacture an integrated circuit. The defect list is compared to a processed netlist corresponding to the integrated circuit and/or a processed layout corresponding to the integrated circuit. The defect is prioritized based, at least in part, on the comparison.

In one embodiment, the processed netlist provides a device location that can be used to identify regions of interest to be used for prioritization of the defect list. For example, a predetermined region around a transistor gate can be defined as a region of interest. In one embodiment, the processed layout provides device geometry and/or critical dimensions that can be used to identify regions of interest to be used for prioritization of the defect list.

DESCRIPTION OF THE DRAWINGS

The invention is illustrated by way of example, and not by way of limitation in the figures of the accompanying drawings in which like reference numerals refer to similar elements.

DETAILED DESCRIPTION

Figure 1:
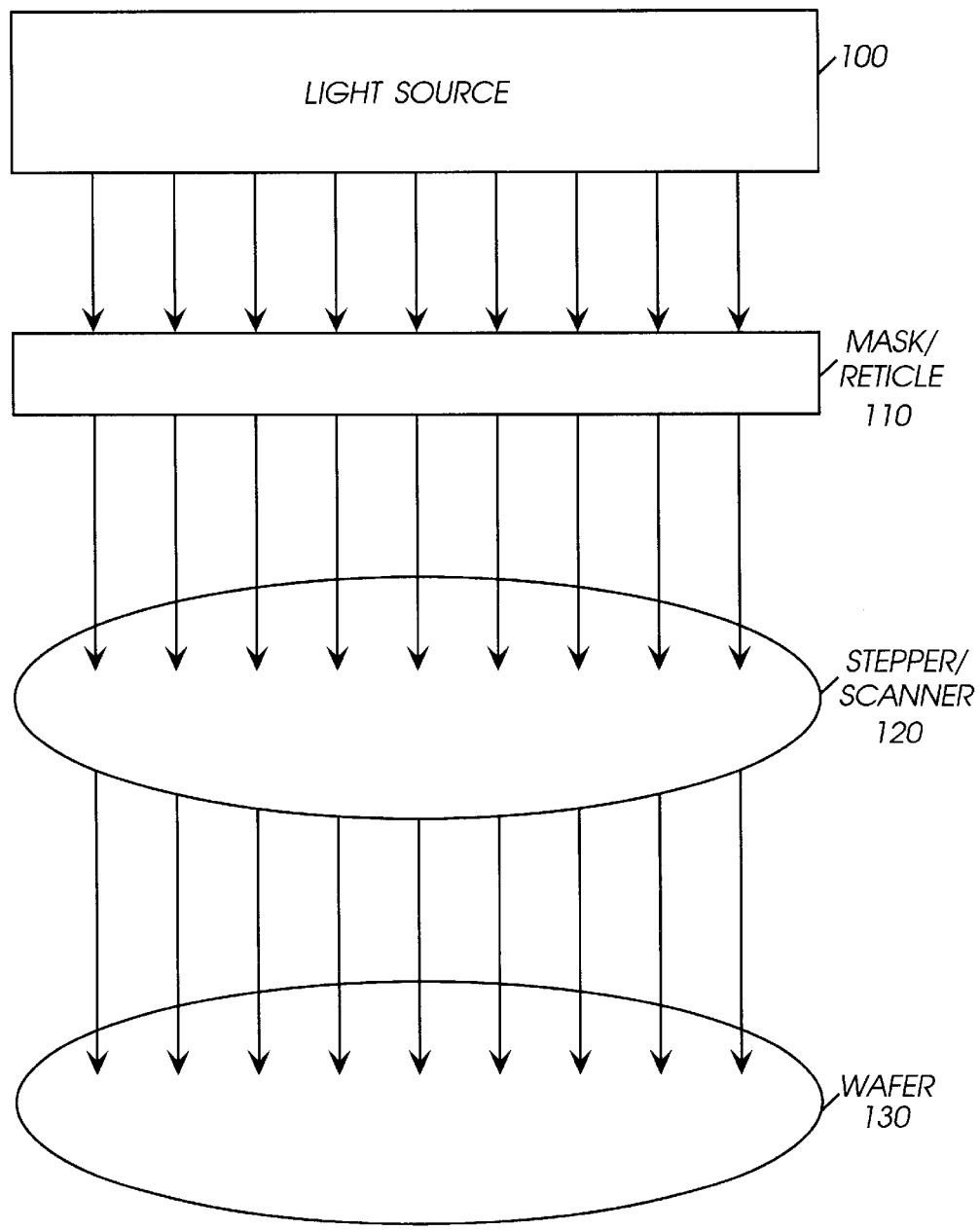
FIG. 1 is one embodiment of an integrated circuit processing arrangement.
Figure 2:
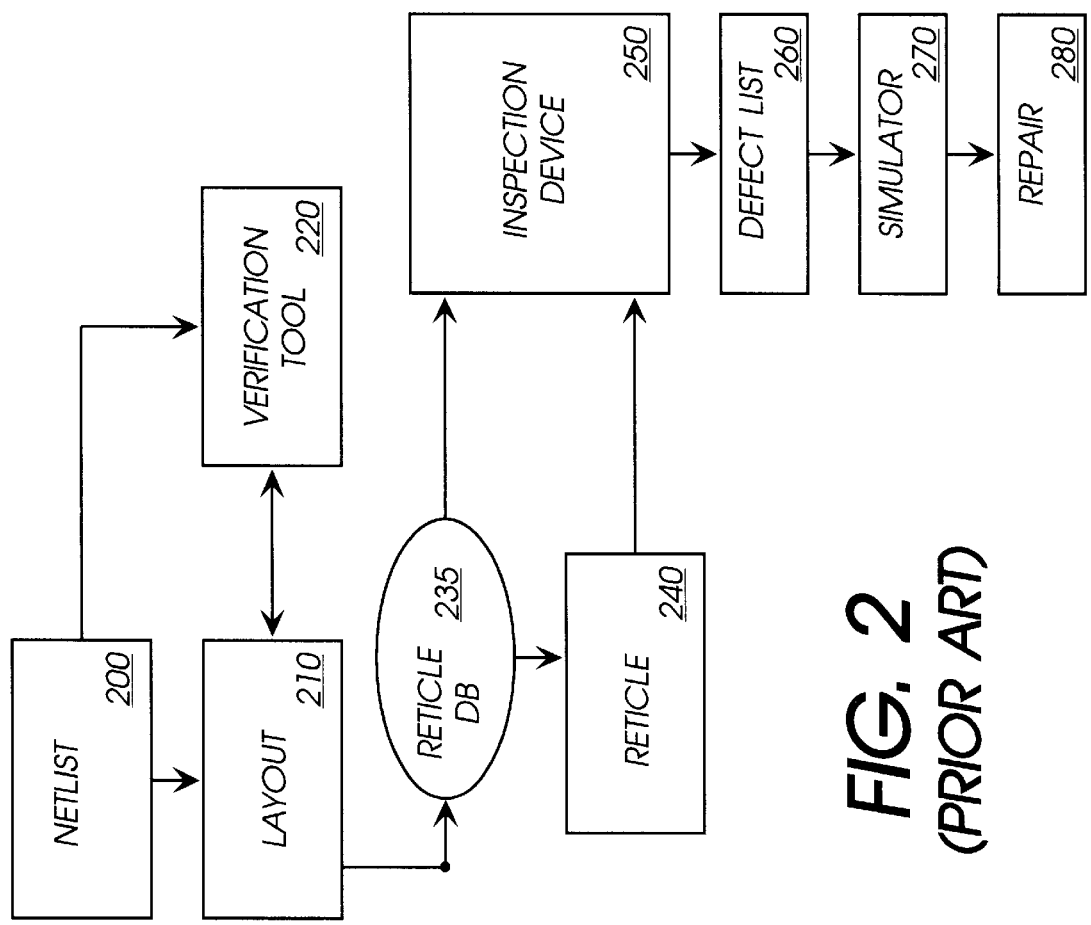
FIG. 2 illustrates a prior art approach to reticle inspection.

Methods and apparatuses for netlist based reticle defect prioritization are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Some portions of the detailed descriptions which follow are presented in terms of algorithms and symbolic representations of operations on data within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention also relates to apparatuses for performing the operations herein. These apparatuses may be specially constructed for the required purposes, or may comprise a general purpose computer selectively activated or reconfigured by a computer program stored in the computer. Such a computer program may be stored in a machine-readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Design-based reticle inspection allows for a more efficient prioritization than typical human labor intensive reticle inspection techniques. Design-based reticle inspection is also more efficient than simulation-based prioritization techniques in that only defects that impact the functionality of the IC are given priority. A processed netlist for an integrated circuit (IC) and/or processed layout of the IC is used to determine the relative priorities of reticle defects identified by a reticle inspection device. In one embodiment, the processed netlist is a netlist that is derived by a verification tool based on a layout of the IC design. The processed netlist can include component coordinates that indicate the position of the components of the IC. In one embodiment, the processed layout includes derived geometry, for example, critical dimensions and/or device identifications that can be used to determine regions of interest.

In one embodiment, defects are prioritized based on the location of the defects with respect to functional portions of the integrated circuit. For example, regions of interest can be determined around certain IC structures (e.g., transistor gates, minimum dimension lines, line corners). In one embodiment, defects within the regions of interest can be repaired while defects outside of the care zone can be ignored. More complex defect prioritization can be provided by prioritizing defects, for example, by size within the regions of interest. By prioritizing defects by areas of interest, the number of defects analyzed by a human operator and/or simulator can be decreased thereby decreasing the cost of reticle inspection and repair.

Methods and apparatuses for design-based reticle inspection as described herein with respect to integrated circuit manufacturing; however, design-based reticle inspection can be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Figure 3:
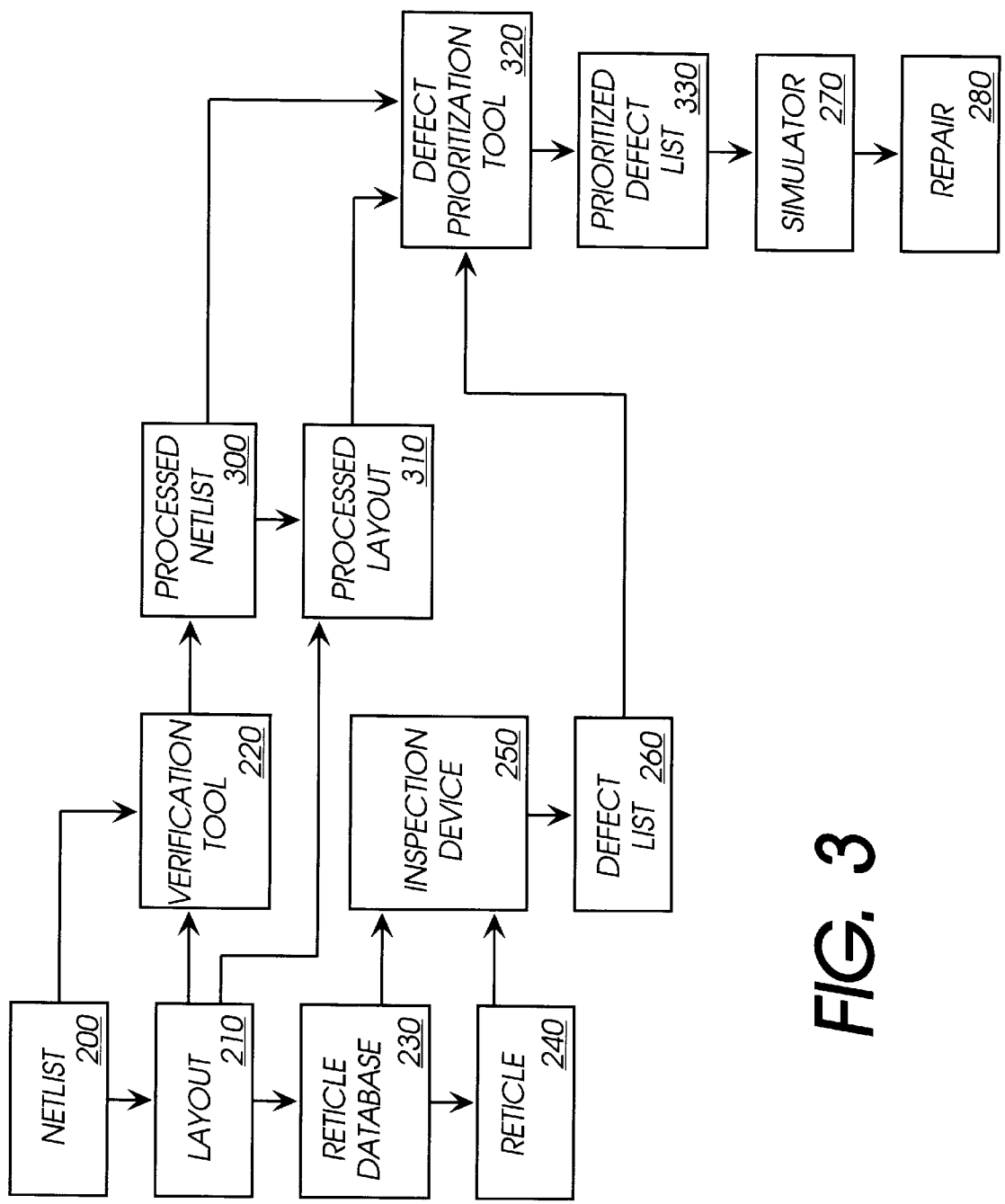
FIG. 3 is a block diagram of one embodiment of design-based reticle inspection.

FIG. 3 is a block diagram of one embodiment of design-based reticle inspection. The design-based reticle inspection technique of FIG. 3 assumes die-to-database reticle inspection. Design-based reticle inspection can also be implemented with die-to-die reticle inspection. Netlist 200 is used by a layout tool (not shown in FIG. 3) to generate layout 210. Verification tool 220 performs a layout versus schematic (LVS) verification process that compares netlist 200 to layout 210 by generating processed netlist 300. Modifications to layout 210 are made as necessary to provide the proper layout. Other and/or additional verification procedures can also be performed where desired.

Layout 210 is used to generate reticle database 230, which is used to generate reticle 240. Reticle inspection and repair is described in terms of a single reticle for reasons of simplicity, however, the reticle inspection technique described can be repeated as desired for additional reticles. Inspection device 250 compares reticle database 230 and reticle 240. Inspection device 250 generates defect list 260.

In one embodiment, defect list 260 includes coordinates, for example, (x,y) coordinates, and alignment points corresponding to the defects listed. The alignment points are points used to align the reticle during the inspection and manufacturing process. The alignment points can be used, for example, as origins for the coordinates of the defects in defect list 260.

In one embodiment, verification tool 220 generates processed netlist 300. Processed netlist 300 can be generated, for example, with a verification tool extraction procedure, or by another procedure. In one embodiment, processed netlist 300 is a netlist generated based on layout 210. Processed netlist 300 describes layout 210. Processed netlist 300 can be compared to netlist 200 by verification tool 220 in an LVS process to determine whether layout 210 is an accurate representation of the IC design described by netlist 200.

Layout 210 can be modified as necessary, for example, through an iterative process, so that processed netlist 300 is a functional equivalent of netlist 200. Processed netlist 300 can be used to identify regions of interest for use with reticle inspection. In one embodiment, the regions of interest correspond to regions in which reticle defects are more likely to cause functional failure than defects outside the regions of interest. For example, regions of interest can be defined around transistor gates, minimum dimension contacts, or other structures that are important to IC functionality. Reticle defects outside the regions of interest, for example, "mousebites" (i.e., small notches at the edge of a line) in a power bus are less important to IC functionality because the power bus is likely to function properly even with the defect.

In one embodiment, the layout tool provides processed layout 310. In an alternate embodiment, verification tool 220 can provide processed layout 310. In one embodiment, processed layout 310 identifies regions of interest with respect to the IC layout. Regions of interest with respect to processed layout 310 can be based on critical dimensions and/or device identification. Processed layout 310 can define regions of interest, for example, around minimum dimension lines, or around minimum sized contacts. Minimum dimensions can be found by the layout tool by, for example, sizing metal structures to be smaller and determining where electrical contact is lost. Device identification can be performed by analyzing the structure of processed layout 300.

The regions of interest can be, for example, a predefined area around particular structures and/or dimensions. A predefined rectangular region around a transistor gate can be a region of interest, or a circular region having a predefined circumference around the transistor gate can define the region of interest. A region of interest with respect to other structures (e.g., contacts, lines, line ends) can be defined in a similar manner. As an additional example, a structure from an IC component library such as, for example, a block of memory cells can be defined as a region of interest. Any set of rules that helps in the prioritization of reticle defects can be used to define a region of interest.

In one embodiment, defect prioritization tool 320 compares defect list 260 with processed netlist 300 and/or processed layout 310 to prioritize the defects. Defect prioritization tool 320 can be part of verification tool 220, an independent entity, or part of another tool, for example, part of a electronic design automation (EDA) tool. In one embodiment, defect prioritization tool 320 prioritizes the defects in defect list 260 by whether or not the defects are in a region of interest as defined with respect to processed netlist 300 and/or processed layout 310. Defects can be further prioritized, for example, by size within regions of interest. The prioritized defects are provided by defect prioritization tool 320 as prioritized defect list 330.

The defects within the regions of interest can be identified for further inspection by a human operator for simulation by simulator and/or repair. In one embodiment, the defects not within the care zones can be ignored and not repaired. Prioritized defect list 330 is input to simulator 270 for simulation and the reticle is repaired at 280. In one embodiment, simulation and repair are performed only for defects within a region of interest.

Figure 4:
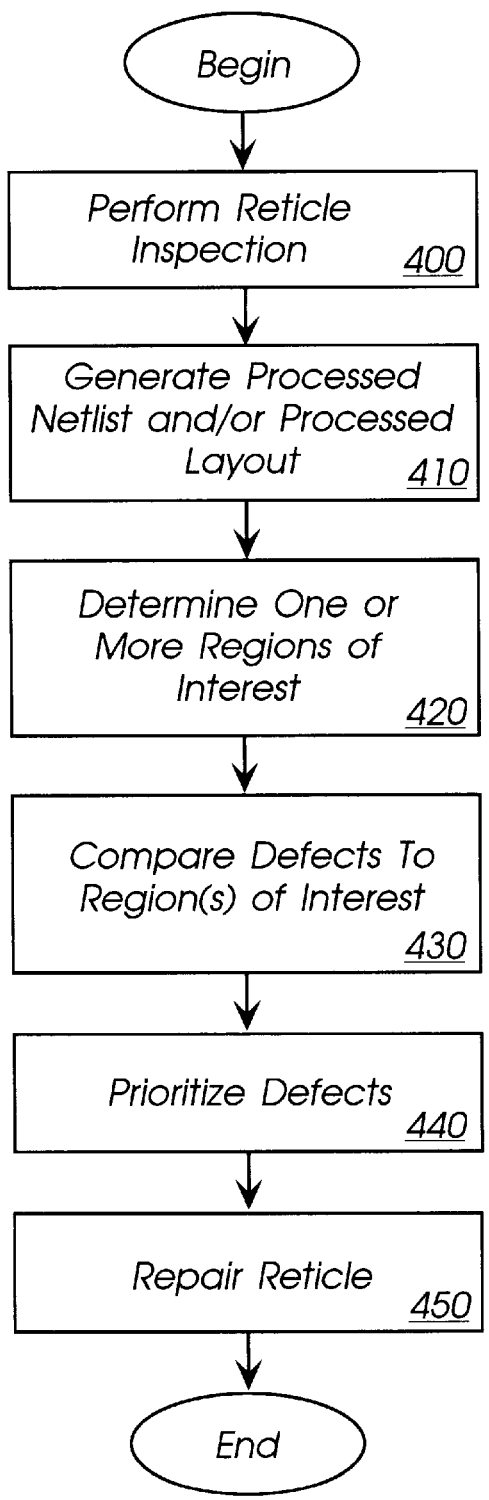
FIG. 4 is a flow diagram of one embodiment of design-based reticle inspection.

FIG. 4 is a flow diagram of one embodiment of design-based reticle inspection. Reticle inspection is performed at 400. In one embodiment, reticle inspection is performed by an inspection tool that compares a reticle and a reticle database used to manufacture the reticle. In alternative embodiments, reticle inspection can be performed by a different device and/or reticle inspection can be performed in a different manner, for example, die-to-die reticle inspection. Reticle inspection results in a list of defects.

A processed netlist and/or a processed layout are/is generated at 410. The processed netlist can be, for example, a netlist generated by a verification tool based on an IC layout. The processed netlist can be used for verification purposes as well as for design-based reticle inspection. The processed layout can be used to identify critical dimensions and/or identify devices that have associated regions of interest. One or more regions of interest are determined at 420. The regions of interest can be determined based on the processed layout and/or the processed netlist, or predefined regions of the IC die.

The defects are compared to the region(s) of interest at 430. As mentioned above, the defects can be identified by alignment points and associated coordinates. The locations of the defects are compared to regions of interest in which repairs are, or are likely to be, critical to the IC manufactured with the reticle. In one embodiment, only defects within a region of interest are simulated and repaired. Other defects are ignored. In an alternative embodiment, defects within a region of interest are given a higher priority then defects not within a region of interest. A human operator can then determine which defects are to be repaired.

In one embodiment, defects are prioritized at 440. Defects can be prioritized as being in a region of interest or outside of a region of interest as well as being prioritized within regions of interest. Prioritization of defects within regions of interest is optional. In one embodiment, defects within regions of interest are prioritized by size; however, other prioritization criteria can be used. For example, defects can be prioritized based on proximity to specific IC structures. For example, defects on or close to a transistor gate can receive a higher priority than defects farther away from the transistor gate, but still within the regions of interest.

The reticle is repaired at 450. The reticle can be repaired in any manner known in the art. In one embodiment, as part of the repair process, a human operator analyzes the prioritized defect list and can provide input to the repair process. Once the reticle is repaired the inspection process can be repeated or the reticle can be used to manufacture ICs.

Figure 5:
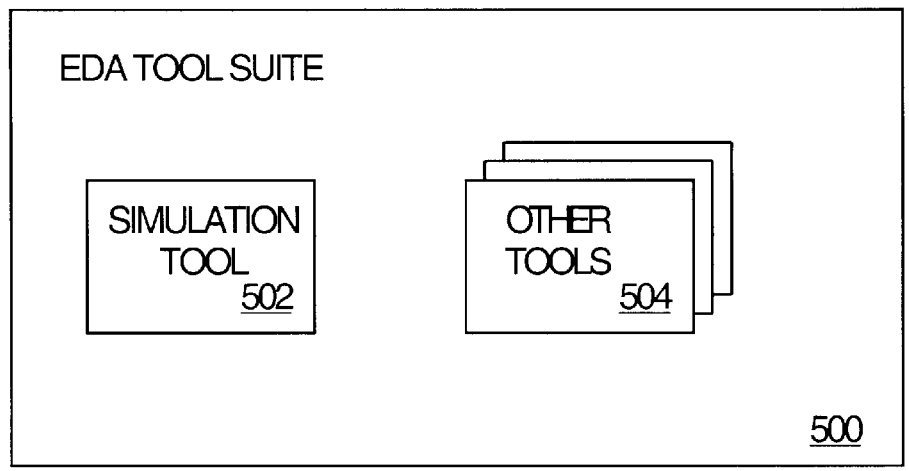
FIG. 5 illustrates an electronic design automation (EDA) tool that can be incorporated with the invention.

FIG. 5 illustrates an electronic design automation (EDA) tool that can be incorporated with the invention. As illustrated, EDA tool suite 500 includes simulation tool 502 incorporated with the teachings of the present invention as described earlier (e.g., verification tool 120 of FIG. 3). Additionally, EDA tool suite 500 includes other tool modules 504. Examples of these other tool modules 502 include but not limited to synthesis module, layout verification module and so forth.

Figure 6:
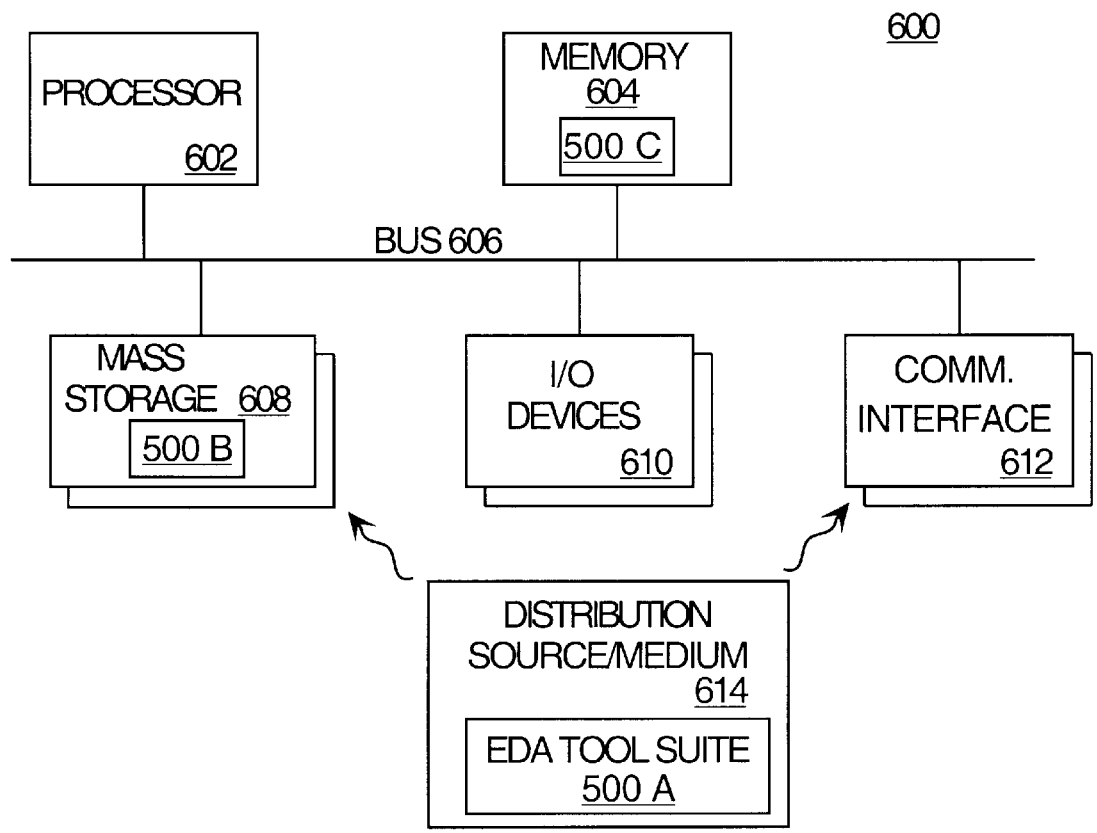
FIG. 6 illustrates one embodiment of a computer system suitable for use to practice the invention.

FIG. 6 illustrates one embodiment of a computer system suitable for use to practice the invention. As shown, computer system 600 includes processor 602 and memory 604 coupled to each other via system bus 606. Coupled to system bus 606 are non-volatile mass storage 608, such as hard disks, floppy disk, and so forth, input/output devices 610, such as keyboard, displays, and so forth, and communication interfaces 612, such as modem, LAN interfaces, and so forth. Each of these elements perform its conventional functions known in the art.

In particular, system memory 604 and non-volatile mass storage 608 are employed to store a working copy and a permanent copy of the programming instructions implementing the above described teachings of the present invention. System memory 604 and non-volatile mass storage 606 may also be employed to store the IC designs. The permanent copy of the programming instructions to practice the present invention may be loaded into non-volatile mass storage 608 in the factory, or in the field, using distribution source/medium 614 and optionally, communication interfaces 612.

Examples of distribution medium 614 include recordable medium such as tapes, CD-ROM, DVD, and so forth. In one embodiment, the programming instructions are part of a collection of programming instructions implementing EDA tool 500 of FIG. 5. The constitution of elements 602–614 are well known, and accordingly will not be further described.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method of prioritizing defects for inspection and/or repair in a mask/reticle used for the photolithographic fabrication of an integrated circuit, comprising:

receiving a netlist that defines structures to be created in a layer of the integrated circuit;

using the netlist to produce a layout of the layer in the integrated circuit;

analyzing the layout with a verification tool to produce a processed netlist and/or a processed layout that identifies regions of interest within the layer of the integrated circuit;

producing a mask/reticle from the layout;

inspecting the mask/reticle to determine a list of defects in the mask/reticle; and comparing the defect list to the processed netlist and/or the processed layout to prioritize the defects in the defect list to define an order in which the defects in the mask/reticle should be inspected and/or repaired.

2. The method of claim 1, wherein the regions of interest are identified as selected structures in the layer of the integrated circuit.

3. The method of claim 1, wherein the regions of interest are identified as areas having selected dimensions in the layer of the integrated circuit.

4. The method of claim 1, wherein the defects are prioritized by determining whether a defect is inside or outside of a region of interest, those defects being inside a region of interest having a higher priority than those outside of a region of interest.

5. The method of claim 4, further comprising prioritizing defects that are inside of a region of interest.

6. The method of claim 5, wherein defects inside of a region of interest are prioritized by sorting the defects by size.

7. A computer readable medium having stored thereon a sequence of instructions that are executable by a processor to perform any of method claims 1–6.

8. A mask for the fabrication of a layer of an integrated client that has been inspected and/or repaired in accordance with the method of claim 1.

9. A computer readable file including a list of defects in a mask/reticle to be inspected and/or repaired that is created by the method of claim 1.

* * * * *